(12) United States Patent
Lee (10) Patent No.: US 11,979,991 B2
(45) Date of Patent: May 7, 2024

(54) DISPLAY APPARATUS AND MANUFACTURING METHOD THEREOF

(71) Applicant: SAMSUNG ELECTRONICS CO., LTD., Suwon-si (KR)

(72) Inventor: Seo Joon Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 286 days.

(21) Appl. No.: 17/436,561

(22) PCT Filed: Nov. 20, 2019

(86) PCT No.: PCT/KR2019/015969
§ 371 (c)(1),
(2) Date: Sep. 3, 2021

(87) PCT Pub. No.: WO2020/179986
PCT Pub. Date: Sep. 10, 2020

(65) Prior Publication Data
US 2022/0183163 A1    Jun. 9, 2022

(30) Foreign Application Priority Data
Mar. 6, 2019   (KR) .................. 10-2019-0025621

(51) Int. Cl.
*H05K 5/00*   (2006.01)
*H04N 5/655*  (2006.01)
*H05K 5/03*   (2006.01)

(52) U.S. Cl.
CPC .......... *H05K 5/0017* (2013.01); *H04N 5/655* (2013.01); *H05K 5/03* (2013.01)

(58) Field of Classification Search
CPC .................. H05K 5/0017; H05K 5/0217
USPC ................ 361/807, 728, 760, 809, 810
See application file for complete search history.

(56) References Cited

U.S. PATENT DOCUMENTS

| 9,632,237 B2 | 4/2017 | Tomomasa |
| 9,880,348 B2 | 1/2018 | Sugimoto |
| 2006/0044745 A1* | 3/2006 | Kim ............... G06F 1/1601 361/679.22 |
| 2006/0160387 A1* | 7/2006 | Kim ............... H01J 11/34 439/160 |
| 2006/0187144 A1* | 8/2006 | Ahn ................ G06F 1/1601 345/37 |

(Continued)

FOREIGN PATENT DOCUMENTS

| KR | 10-0708749 | 4/2007 |
| KR | 10-2007-0106230 | 11/2007 |
| KR | 10-2017-0125690 | 11/2017 |

OTHER PUBLICATIONS

Office Action dated Jun. 20, 2023, in Korean Application No. 10-2019-0025621.

(Continued)

*Primary Examiner* — Hung S. Bui
(74) *Attorney, Agent, or Firm* — STAAS & HALSEY LLP (57) ABSTRACT

A display apparatus including an improved chassis and a manufacturing method thereof. The display apparatus includes a display panel, a chassis including a plate provided to cover the display panel and a coupling part on the plate, and stacked structures 3D printed on the plate coupled to the coupling art.

12 Claims, 7 Drawing Sheets

(56) References Cited

U.S. PATENT DOCUMENTS

| | | | | |
|---|---|---|---|---|
| 2006/0192730 A1* | 8/2006 | Kim | ............. | H05K 5/02 |
| | | | | 345/60 |
| 2007/0076384 A1* | 4/2007 | Shin | ............. | G06F 1/1601 |
| | | | | 361/752 |
| 2007/0267549 A1* | 11/2007 | Bang | ............. | F16M 11/22 |
| | | | | 361/679.02 |
| 2008/0007903 A1* | 1/2008 | Kim | ............. | H05K 7/142 |
| | | | | 361/725 |
| 2008/0252557 A1* | 10/2008 | Lee | ............. | H05K 5/02 |
| | | | | 345/41 |
| 2014/0361495 A1* | 12/2014 | Swasey | ............. | F16J 15/0825 |
| | | | | 156/60 |
| 2017/0042031 A1 | 2/2017 | Robin | | |
| 2017/0233093 A1 | 8/2017 | Sanders | | |
| 2019/0166731 A1* | 5/2019 | Kuk | ............. | H05K 3/30 |
| 2020/0139631 A1* | 5/2020 | Buller | ............. | B33Y 50/00 |

OTHER PUBLICATIONS

International Search Report dated Mar. 20, 2020 in International Application No. PCT/KR2019/015969.
Office Action dated Dec. 27, 2023, in Korean Application No. 10-2019-0025621.

* cited by examiner

DISPLAY APPARATUS AND MANUFACTURING METHOD THEREOF

CROSS-REFERENCE TO RELATED APPLICATIONS

This application is a US National Stage application of International Application PCT/KR2019/015969 filed Nov. 20, 2019, and claims foreign priority to Korean application 10-2019-0025621 filed Mar. 6, 2019.

FIELD

The present disclosure relates to a display apparatus including an improved chassis and a manufacturing method thereof.

DESCRIPTION OF RELATED ART

A display apparatus is an apparatus that displays visual and stereoscopic image information.

The display apparatus may include all types of devices implemented in various forms, including not only a television (TV) and a monitor but also a portable multimedia device, such as a personal digital assistant (PDA) and a portable multimedia player (PMP) for digital broadcasting, and a portable communication device, such as a smartphone and a wearable device.

The display apparatus may include a display panel and a chassis. The chassis may include a front chassis provided to cover the front of the display panel, and a rear chassis provided to cover the rear of the display panel.

In general, the rear chassis may be molded using a press mold. However, in the case of a large display apparatus, the production quantity is small, but the cost of manufacturing the press mold may be large.

The rear chassis may be manufactured by processing a metal plate using a numerical control turret punch press (NCT) or the like and combining a fastening member including separate aluminum extrusion component, a bracket, and the like. However, the combining process may take a lot of time and high cost.

By surface-treating such as chemical etching, laser processing on the metal plate and then inserting and injecting the metal plate into a mold for injection molding, the fastening member may be molded directly onto the metal plate. However, since a mold for insert-injecting the metal plate and a large injection molding machine are required, the manufacturing cost may be high.

A front chassis including a metal material may be manufactured through aluminum extrusion molding, or a front chassis including a plastic material may be manufactured through injection molding using a plastic resin.

Since the front chassis including a metal material may have many restrictions in its shape that can be implemented, may require post-processing, and may be limited for material to be an aluminum, the manufacturing cost may be high.

The front chassis including a plastic material may be advantageous in terms of shape implementation and cost, but the plastic material may have many design restrictions, and may lack a relatively luxurious feeling compared with the metal material.

SUMMARY

An aspect of the present disclosure provides a display apparatus including a display panel, a chassis including a plate provided to cover the display panel, and a coupling part on the plate, and stacked structures 3D printed on the plate and thereby coupled to the coupling part.

The coupling part may be integrally formed with the plate and may have a material different from that of the stacked structures.

The coupling part may include a metal material, and the stacked structures may be formed of a resin material.

The structure may be melted pelletized resin.

The chassis may further include a rear chassis configured to cover a rear of the display panel, and the stacked structures may include a fastening member provided to be fastened to a printed circuit board mounted on the rear chassis.

The chassis may further include a front chassis configured to cover a front of the display panel, and the stacked structures may include a reinforcing member provided to reinforce rigidity of the front chassis.

The coupling part may include a coupling hole provided on the plate so that a lower structure of the stacked structures is inserted in the coupling hole, and a burring protruding from an edge of the coupling hole.

The coupling part may include an undercut to prevent the stacked structures from being separated from the coupling part.

The burring may be inclined outwardly from the coupling hole.

The burring may include a screw thread on an inner circumferential surface of the burring.

The coupling part may include a concave/convex surface on a surface of the plate and interfering with at least one structure of the stacked structures.

The concave/convex surface may be finely formed on a surface of the plate by electric discharge machining.

The coupling part may include a reinforcing part in contact with at least one structure of the stacked structures to strengthen coupling of the stacked structures and the coupling part.

Another aspect of the present disclosure provides a display apparatus including a display panel, a chassis including a rear chassis having a plate of a metal material and provided to cover one side of the display panel and a front chassis provided to cover the other side of the display panel, and a structure configured to be stacked and molded by 3D printing and including a fastening member provided to be fastened to a printed circuit board mounted on the rear chassis and a reinforcing member provided to reinforce the rigidity of the front chassis, wherein the chassis further includes a coupling part having an undercut provided such that the structure is coupled to the chassis.

The coupling part may include a coupling hole provided on the plate of the rear chassis so that the fastening member is inserted, and a burring protruding from an edge of the coupling hole.

The coupling part may include a concave/convex surface configured to be finely formed by electric discharge machining on a surface of the plate of the front chassis to be fastened with the reinforcing member.

Another aspect of the present disclosure provides a manufacturing method of a display apparatus including providing a chassis including a plate provided to cover a display panel, forming a coupling part by processing the plate so that a structure provided on the chassis is coupled to the plate, and molding the structure on the plate by 3D printing (three dimensional printing) to be coupled to the coupling part.

The coupling part may include a coupling hole provided on the plate so that the structure is inserted by a burring punch process, and a burring protruding from an edge of the coupling hole.

The coupling part may include a concave/convex surface formed such that the structure is coupled to a surface of the plate by electric discharge machining.

The structure may be formed by melting a pelletized resin and stacking the melted resin on the plate, and a reinforcing part may be formed on the burring in contact with the structure to strengthen coupling of the structure and the coupling part.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

The embodiments described in the present specification and the configurations shown in the drawings are only examples of preferred embodiments of the present disclosure, and various modifications may be made at the time of filing of the present disclosure to replace the embodiments and drawings of the present specification.

Like reference numbers or signs in the various drawings of the application represent parts or components that perform substantially the same functions.

The terms used herein are for the purpose of describing the embodiments and are not intended to restrict and/or to limit the present disclosure. For example, the singular expressions herein may include plural expressions, unless the context clearly dictates otherwise.

The terms "comprises" and "has" are intended to indicate that there are features, numbers, steps, operations, elements, parts, or combinations thereof described in the specification, and do not exclude the presence or addition of one or more other features, numbers, steps, operations, elements, parts, or combinations thereof.

It will be understood that, although the terms first, second, etc. may be used herein to describe various components, these components should not be limited by these terms. These terms are only used to distinguish one component from another.

For example, without departing from the scope of the present disclosure, the first component may be referred to as a second component, and similarly, the second component may also be referred to as a first component. The term "and/or" includes any combination of a plurality of related items or any one of a plurality of related items.

In this specification, the terms "front end," "rear end," "upper portion," "lower portion," "upper end" and "lower end" used in the following description are defined with reference to the drawings, and the shape and position of each component are not limited by these terms.

Hereinafter, embodiments of the present disclosure will be described in detail with reference to the accompanying drawings.

The present disclosure is directed to providing a display apparatus improved such that a structure is directly molded on a metal plate through 3D printing, and a manufacturing method thereof.

The present disclosure is directed to providing a display apparatus improved such that a structure is molded onto a metal plate and coupled together at the same time, and a manufacturing method thereof.

The present disclosure is directed to providing a display apparatus improved such that a design freedom of a front chassis including a metal material increases, and a manufacturing method thereof.

According to the present disclosure, as a structure is directly molded onto a metal plate through 3D printing, a press mold is not required when a chassis is manufactured, thereby reducing the manufacturing cost.

According to the present disclosure, as the structure is molded onto and coupled to the metal plate at the same time, a process in which the structure is coupled to the metal plate can be omitted, thereby saving the manufacturing time According to the present disclosure, a design freedom of a front chassis including a metal material can increase.

Figure 1:
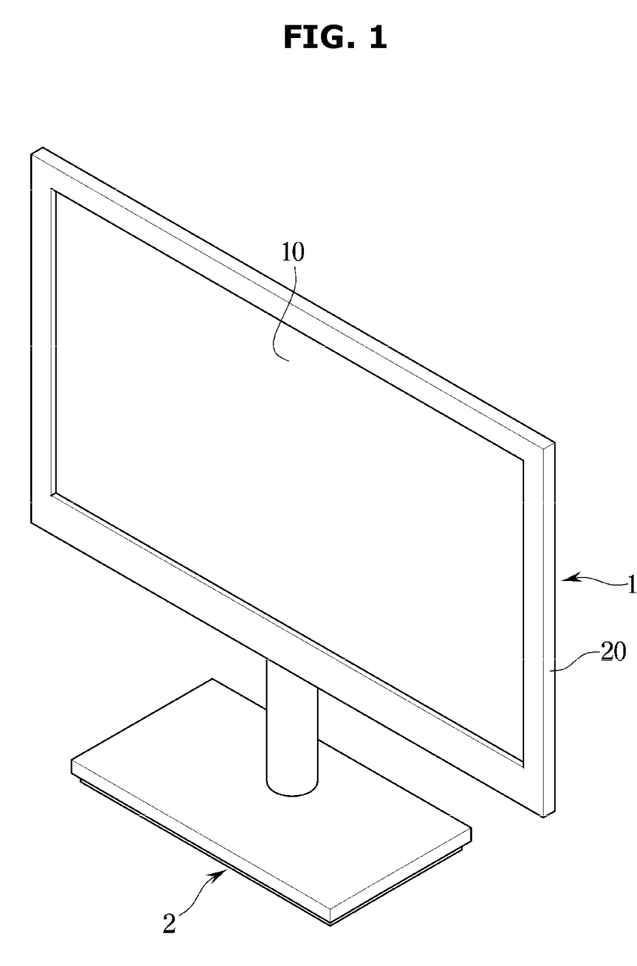
FIG. 1 is a perspective view of a display apparatus according to the present disclosure.
Figure 2:
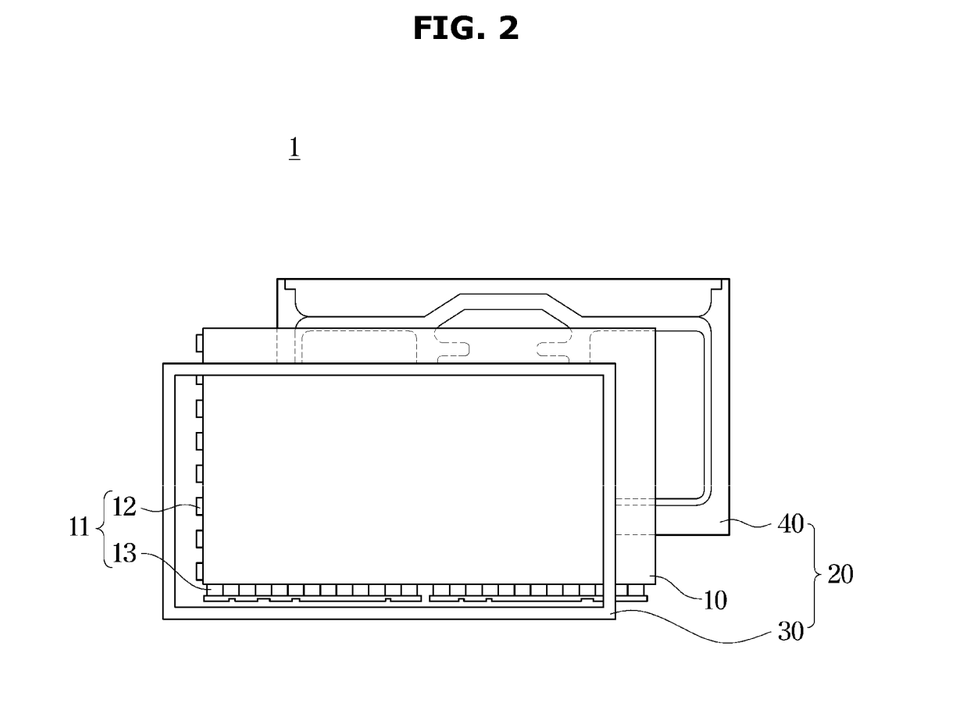
FIG. 2 is an exploded view of the display apparatus according to the present disclosure.

FIG. 1 is a perspective view of a display apparatus according to the present disclosure. FIG. 2 is an exploded view of the display apparatus according to the present disclosure. As illustrated in FIGS. 1 and 2, a display apparatus 1 may display an image and output a sound. Herein, the sound may be output through an external device.

The display apparatus 1 may be supported by a stand 2 mounted on a lower end thereof, and may be installed on a wall by a separate bracket (not shown) or the like. The display apparatus 1 may include a display panel 10 and a chassis 20 provided to cover the display panel 10.

The display panel 10 may include an image driver 11 provided to drive an image. The image driver 11 may include a first image driver 12 for driving an X electrode and a second image driver 13 for driving a Y electrode. Herein, the X electrode may include a source electrode, and the Y electrode may include a gate electrode.

The chassis 20 may include a front chassis 30 provided to cover one side of the display panel 10, and a rear chassis 40 provided to cover the other side of the display panel 10.

The rear chassis 40 may be provided to cover the rear of the display panel 10, and the front chassis 30 may be provided to cover the front of the display panel 10.

Various input/output devices may be mounted on the rear chassis 40 which is a chassis that connects various components necessary for image display and sound output.

The rear chassis 40 may be made of metal having excellent heat dissipation and strength. However, the present disclosure is not limited thereto. That is, the rear chassis 40 may include a flat plate shape. However, the present disclosure is not limited thereto.

The front chassis 30 may support the display panel 10. The front chassis 30 may fix the display panel 10 and may be detachably coupled to the rear chassis 40.

The front chassis 30 may support an edge of the display panel 10 so that at least a portion of the front of the display panel 10 may be exposed to the outside. However, the present disclosure is not limited thereto.

The front chassis 30 may form an accommodation space when coupled with the rear chassis 40, and the display panel 10 and the like may be disposed in the accommodation space.

In the display apparatus 1 according to the present disclosure, the chassis 20 to cover the display panel 10 forms an exterior of the display panel 10, but is not limited thereto, and the display apparatus 1 may include a separate cover (not shown) provided to cover the chassis 20 and form an exterior of the display panel 10.

Figure 3:
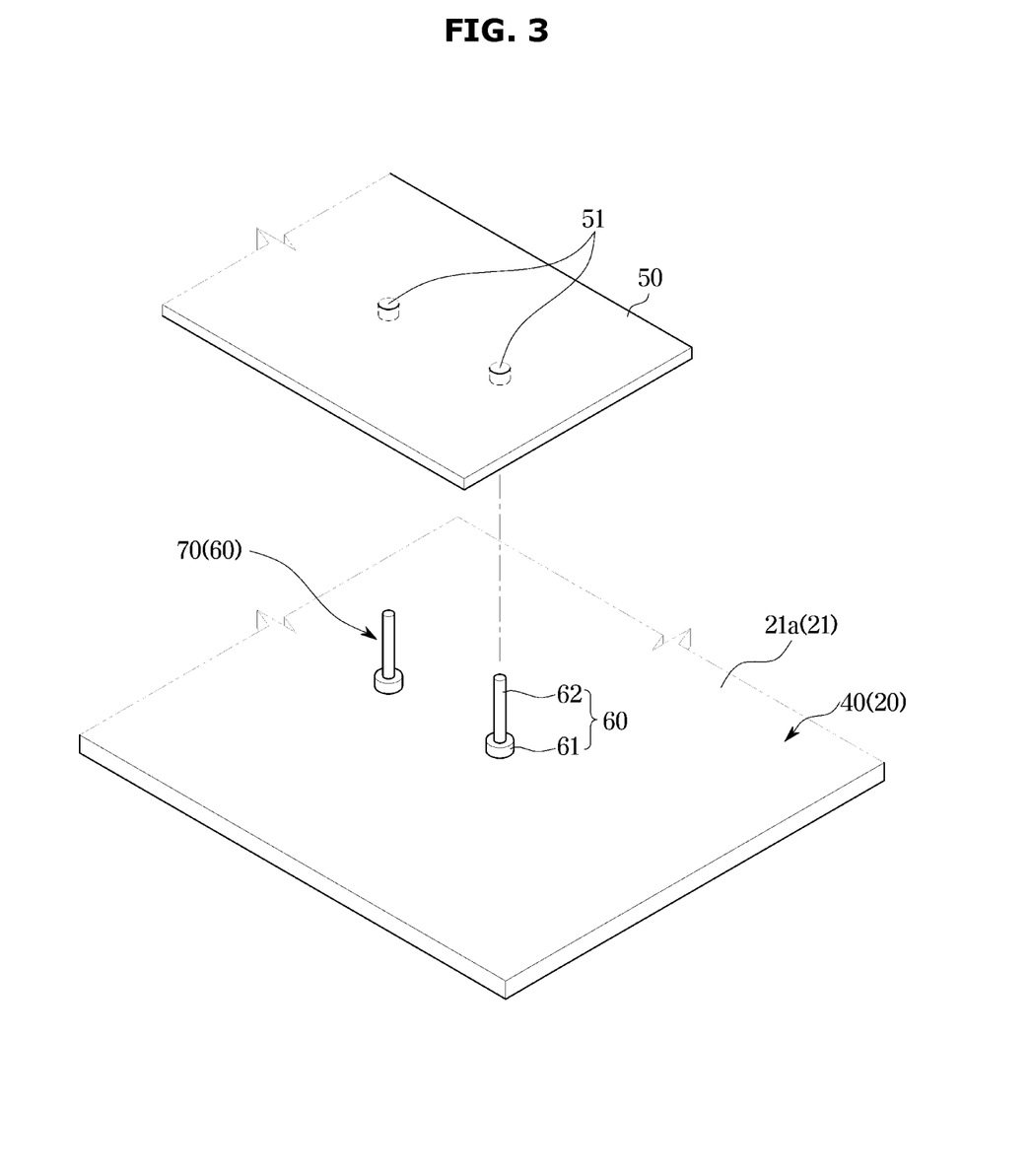
FIG. 3 is a view illustrating that a printed circuit board is coupled to a rear chassis in the display apparatus according to an embodiment of the present disclosure.
Figure 4:
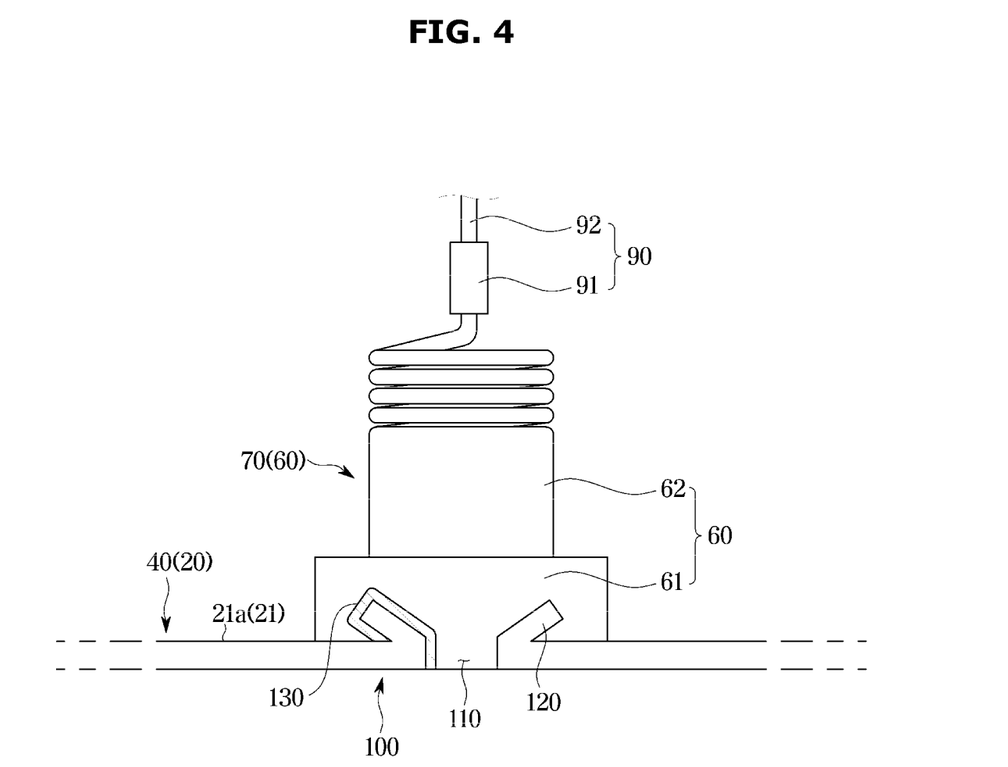
FIG. 4 is a view illustrating that a fastening member is stacked on and coupled to the rear chassis in the display apparatus according to the embodiment of the present disclosure.

FIG. 3 is a view illustrating that a printed circuit board is coupled to a rear chassis in the display apparatus according to an embodiment of the present disclosure. FIG. 4 is a view illustrating that a fastening member is stacked on and coupled to the rear chassis in the display apparatus according to an embodiment of the present disclosure.

As illustrated in FIGS. 3 and 4, the display apparatus 1 (see FIG. 1) according to an embodiment of the present disclosure may include a printed circuit board 50 mounted on the rear chassis 40 to drive the display panel 10 (see FIG. 2).

The chassis 20 may include a plate 21 provided to cover the display panel 10. For convenience, in FIGS. 3 and 4, the chassis 20 may be described as the rear chassis 40, and the plate 21 of the chassis 20 may be described as a plate 21a of the rear chassis 40.

The printed circuit board 50 may be disposed in front of the rear chassis 40. However, the present disclosure is not limited thereto.

The chassis 20 may include a structure 60 provided on the chassis 20. The structure 60 according to an embodiment of the present disclosure may include a fastening member 70 provided to be fastened to the printed circuit board 50 mounted on the rear chassis 40.

However, the present disclosure is not limited thereto, and the structure 60 may include various components that may be provided on the chassis 20.

The fastening member 70 may include a stud or boss provided to fasten the printed circuit board 50 mounted on the rear chassis 40. However, the present disclosure is not limited thereto.

FIG. 3 illustrates that two of the fastening members 70 are provided, but is not limited thereto.

The structure 60 may include a first structure 61 on which the printed circuit board 50 is supported, and a second structure 62 protruding from the first structure 61. The first structure 61 may be in contact with the plate 21. FIG. 3 illustrates that the structure 60 is formed in a cylindrical shape, but is not limited thereto.

The printed circuit board 50 may include a passing hole 51 through which the second structure 62 is inserted. FIG. 3 illustrates that two of the passing holes 51 are provided, but is not limited thereto, and the number of the passing holes 51 may correspond to the number of the fastening members 70.

The structure 60 according to the present disclosure may be stacked and molded onto the chassis 20 by 3D printing.

In general, the 3D printing (three dimensional printing) may be associated with a variety of techniques including fused deposition modeling (FDM), electron beam freeform fabrication (EBF), selective laser sintering (SLS), or other types of three dimensional printing techniques.

A structure formed from the 3D printing may be used with an object formed by other manufacturing technique. A 3D printing equipment 90 for the 3D printing may include a printing device (not shown), a computing system (not shown), and the like.

The 3D printing, or "three-dimensional printing," may include various techniques for forming a three-dimensional object by stacking successive layers of material one after another on another object.

In particular, the 3D printing according to the present disclosure may include manufacturing using a resin in the form of a molten filament or pellet.

The 3D printing equipment 90 may include a nozzle 91 for flowing a molding material 92. The one or more nozzles 91 may be provided to deliver the molding material 92 to the target location. The nozzle 91 may be configured to control the flow of the molding material 92 exiting the nozzle 91.

The structure 60 may be directly stacked and molded onto the plate 21 using resin molten from filaments or pellets. In particular, the structure 60 according to the present disclosure may be formed by melting and stacking a pelletized resin. However, the present disclosure is not limited thereto.

The molding material 92 flowing through the nozzle 91 may be stacked on the plate 21 to form the first structure 61 and form the second structure 62 on the first structure 61.

The structure 60 may include a material different from that of the chassis 20. The chassis 20 may include a metal material, and the structure 60 may include a resin material. In particular, the structure 60 may include a plastic resin. However, the present disclosure is not limited thereto.

The display apparatus 1 (see FIG. 1) according to the present disclosure may include a coupling part 100 provided on the plate 21 to couple the chassis 20 and the structure 60 including different materials from that of the chassis 20.

The coupling part 100 may be integrally formed with the plate 21 and may have a material different from that of the structure 60. The coupling part 100 may include a metal material, and the structure 60 may include a resin material. However, the present disclosure is not limited thereto.

The coupling part 100 may include a coupling hole 110 provided on the plate 21 so that the structure 60 is inserted, and a burring 120 protruding from an edge of the coupling hole 110. At least a portion of the structure 60 may be inserted into the coupling hole 110.

The coupling part 100 may be provided on the plate 21a of the rear chassis 40. The coupling part 100 may be formed by performing a burring punch process on the plate 21. However, the present disclosure is not limited thereto.

The coupling hole 110 may be provided on the plate 21a of the rear chassis 40 so that the fastening member 70 is inserted, and the burring 120 may protrude from the edge of the coupling hole 110.

The coupling part 100 may include an undercut to prevent the structure 60 from being separated from the coupling part 100.

The coupling part 100 according to an embodiment of the present disclosure may simultaneously form both the coupling hole 110 and the burring 120 having the undercut through the burring punch process. Accordingly, a separate injection molding process for forming the undercut may be omitted.

The burring 120 may be provided to be inclined. The burring 120 may be provided to be inclined outwardly from the coupling hole 110. The burring 120 may be inclined in a direction away from the coupling hole 110. However, the present disclosure is not limited thereto.

The coupling part 100 may include a reinforcing part 130 provided to strengthen coupling of the structure 60 and the coupling part 100.

The reinforcing part 130 may be in contact with the structure 60. The reinforcing part 130 may be in contact with the coupling hole 110 or the burring 120. The reinforcing part 130 may be provided on an inner circumferential surface of the coupling hole 110. The reinforcing part 130 may be provided on the outside of the burring 120 to cover the burring 120. However, the present disclosure is not limited thereto.

The reinforcing part 130 may be formed by performing a blasting process on the coupling hole 110 or the burring 120 to increase a surface area of the coupling part 100 coupled to the structure 60.

The reinforcing part 130 may include an adhesive applied to the coupling hole 110 or the burring 120. The adhesive may include an epoxy-based thermosetting adhesive. However, the present disclosure is not limited thereto.

FIG. 4 illustrates that the reinforcing part 130 is provided only on one side of the coupling hole 110 and the burring 120, but is not limited thereto, and the reinforcing part 130 may be provided in the entire coupling hole 110 and burring 120.

Also, FIG. 4 illustrates that the structure 60 is not inserted into a lower portion of the plate 21 through the coupling hole 110, but is not limited thereto, and the structure 60 may extend to the lower portion of the plate 21 through the coupling hole 110.

The structure 60 extending to and stacked on the lower portion of the plate 21 through the coupling hole 110 by a separate molding member (not shown) detachably provided at the lower portion of the plate 21 is cured to have a size larger than a diameter of the coupling hole 110, so that the structure 60 may interfere with the coupling hole 110 to be coupled to the plate 21 without a separate undercut structure.

A portion of the structure 60 extending to and cured on the lower portion of the plate 21 may be the same as a size of the first structure 61 mounted on an upper portion of the plate 21. However, the present disclosure is not limited thereto.

Figure 5:
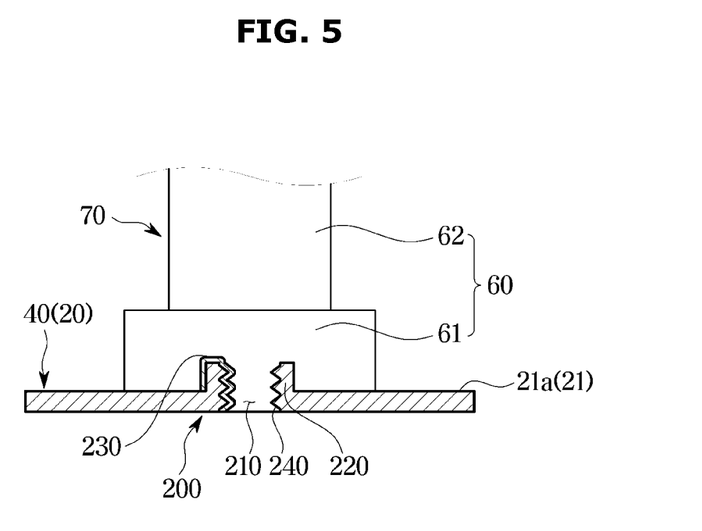
FIG. 5 is a view illustrating a coupling part including a screw thread in a display apparatus according to other embodiment of the present disclosure.

FIG. 5 is a view illustrating a coupling part including a screw thread in a display apparatus according to another embodiment of the present disclosure. As illustrated in FIG. 5, the rear chassis 40 according to another embodiment of the present disclosure may include the fastening member 70 provided on the rear chassis 40.

The structure 60 according to another embodiment of the present disclosure may include the fastening member 70 provided to be fastened to the printed circuit board 50 (see FIG. 3) mounted on the rear chassis 40.

The fastening member 70 may include the first structure 61 on which the printed circuit board 50 is supported, and the second structure 62 protruding from the first structure 61.

The rear chassis 40 according to another embodiment of the present disclosure may include a coupling part 200 provided on the plate 21*a* to couple the rear chassis 40 and the fastening member 70 including different materials from that of the rear chassis 40.

The coupling part 200 may be integrally formed with the plate 21*a* and may have a material different from that of the fastening member 70. The coupling part 200 may include a metal material, and the fastening member 70 may include a resin material. However, the present disclosure is not limited thereto.

The coupling part 200 may include a coupling hole 210 provided on the plate 21*a* so that the fastening member 70 is inserted, and a burring 220 protruding from an edge of the coupling hole 210. A portion of the fastening member 70 may be inserted into the coupling hole 210.

The coupling part 200 may include an undercut to prevent the fastening member 70 from being separated from the coupling part 200.

The coupling part 200 according to another embodiment of the present disclosure may simultaneously form both the coupling hole 210 and the burring 220 having the undercut through the burring punch process. Accordingly, a separate injection molding process for forming the undercut may be omitted.

The burring 220 may include a screw thread 240 provided on an inner circumferential surface of the burring 220. The screw thread 240 may extend to an inner surface of the burring 220 protruding from the coupling hole 210. The screw thread 240 may include various shapes as long as it has the undercut.

The coupling part 200 may include a reinforcing part 230 provided to strengthen coupling of the fastening member 70 and the coupling part 200.

The reinforcing part 230 may be in contact with the fastening member 70. The reinforcing part 230 may be in contact with the burring 220 or the screw thread 240. The reinforcing part 230 may be provided on the screw thread 240. The reinforcing part 230 may be provided on the burring 220 to cover the burring 220. However, the present disclosure is not limited thereto.

Figure 6:
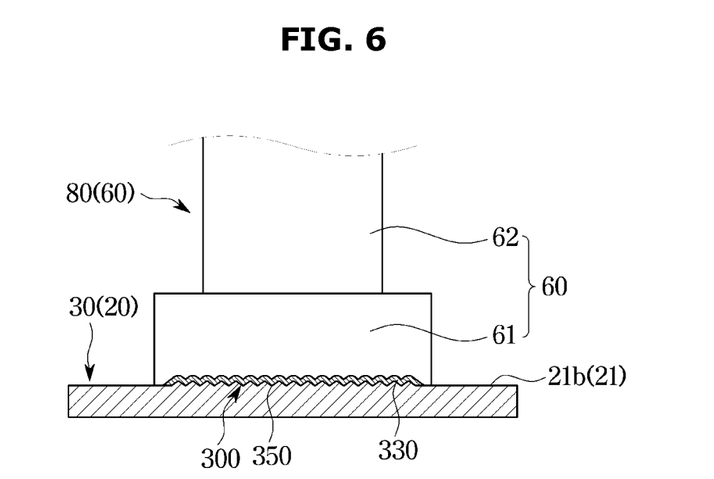
FIG. 6 is a view illustrating a coupling part including a concave/convex surface in a display apparatus according to another embodiment of the present disclosure.

FIG. 6 is a view illustrating a coupling part including a concave/convex surface in a display apparatus according to another embodiment of the present disclosure. As illustrated in FIG. 6, the chassis 20 according to another embodiment of the present disclosure may include the structure 60 provided in the chassis 20.

The structure 60 according to another embodiment of the present disclosure may include a reinforcing member 80 provided to reinforce the rigidity of the front chassis 30. The reinforcing member 80 may include a rib and the like. However, the present disclosure is not limited thereto, and the reinforcing member 80 may include various components that may be provided on the front chassis 30.

The reinforcing member 80 may include the first structure 61 coupled to a plate 21*b* and the second structure 62 protruding from the first structure 61.

The reinforcing member 80 may include a material different from that of the front chassis 30. The front chassis 30 may include a metal material, and the reinforcing member 80 may include a resin material. In particular, the reinforcing member 80 may include a plastic resin. However, the present disclosure is not limited thereto.

The front chassis 30 according to the present disclosure may include a coupling part 300 provided on the plate 21*b* to couple the front chassis 30 and the reinforcing member 80 including different materials.

The coupling part 300 may be integrally formed with the plate 21*b* and may have a material different from that of the reinforcing member 80. The coupling part 300 may include a metal material.

The coupling part 300 may include a concave/convex surface 350 provided on a surface of the plate 21 to interfere with the structure 60. The coupling part 300 may include the concave/convex surface 350 that is finely formed by performing electric discharge machining on a surface of the plate 21*b* of the front chassis 30 so as to be coupled to the reinforcing member 80.

Unlike the rear chassis 40 (see FIG. 4), which may include the coupling hole 110 (see FIG. 4), and the like, formed through the burring punch process, it is difficult or impossible to process a hole, and the like, on the front chassis 30, and thus it may be difficult to form the coupling hole 110 and the burring 120 having an undercut on the front chassis 30.

Accordingly, the coupling part 300 may couple the reinforcing member 80 to the front chassis 30 through the concave/convex surface 350 including a fine undercut.

The coupling part 300 may include an undercut to prevent the reinforcing member 80 from being separated from the coupling part 300.

The concave/convex surface 350 having the fine undercut may be formed by the electric discharge machining. In general, an electric discharge machining method using an electrode (using Cu, Carbon, etc.) may be used.

A roughness of a surface to be machined depending on machining conditions may be adjusted by the electric discharge machining, and in order to make a surface having a fine undercut shape of the concave/convex surface 350 according to another embodiment of the present disclosure, it may be necessary to perform the electric discharge machining under a roughing condition having a large current.

A roughing condition of the electric discharge machining may vary depending on an electrode and a material, but in general, the condition in which a discharge current is 20 A or more, a discharge time (pulse) is 100 ms or more, and a discharge efficiency (duty factor) is 50% or more may be used.

In order to form the concave/convex surface 350 having a relatively effective undercut shape, the electric discharge machining using two electrodes may be used. A general electrode passes through a masking electrode having a fine shape, such as a mesh, and the shape of the masking electrode is formed on the plate 21b, whereby the electric discharge machining may be performed The coupling part 300 may include a reinforcing part 330 provided to strengthen coupling of the reinforcing member 80 and the coupling part 300.

The reinforcing part 330 may be in contact with the reinforcing member 80. The reinforcing part 330 may be in contact with the concave/convex surface 350. The reinforcing part 330 may be provided on one side of the concave/convex surface 350.

The reinforcing part 330 may be provided on an upper portion of the concave/convex surface 350. The reinforcing part 330 may be provided on at least a portion of the concave/convex surface 350. However, the present disclosure is not limited thereto.

The reinforcing part 330 may be formed by performing the blasting process on the concave/convex surface 350 to increase a surface area of the coupling part 300. The reinforcing part 330 may include an adhesive applied to the concave/convex surface 350. The reinforcing part 330 may be formed by performing a chemical etching process on the concave/convex surface 350 to increase the undercut. However, the present disclosure is not limited thereto.

The concave/convex surface 350 may be formed by processing the plate 21b through a high-power laser. In the laser processing, a diameter of a laser beam may be focused to 0.1 mm or less. However, the present disclosure is not limited thereto.

Figure 7:
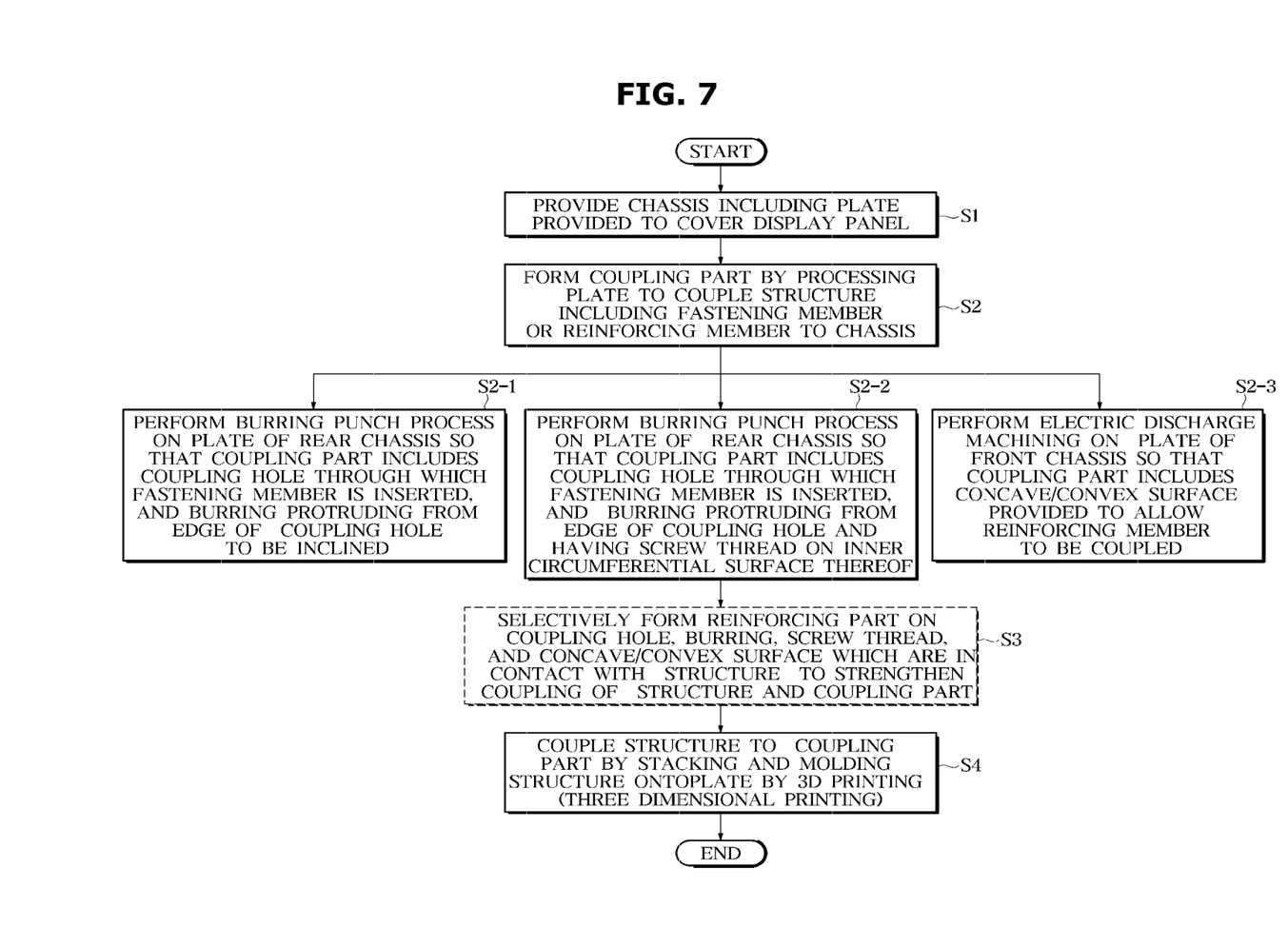
FIG. 7 is a flowchart in which a structure is stacked on and coupled to a chassis in the display apparatus according to the present disclosure.

FIG. 7 is a flowchart in which a structure is stacked on and coupled to a chassis in the display apparatus according to the present disclosure. Hereinafter, an order in which the structure 60 of the display apparatus 1 (see FIG. 1) according to the present disclosure is stacked on and coupled to the chassis 20 will be described with reference to FIG. 7.

First, the chassis 20 including the plate 21 provided to cover the display panel 10 may be provided (S1).

By processing the plate 21, the coupling part 100 may be formed (S2), so that the coupling part 100 can be provided to couple the structure 60 including the fastening member 70 or the reinforcing member 80 to the chassis 20.

In this case, the structure 60 and the chassis 20 may include different materials, and the coupling part 100 integrally formed with the chassis 20 may be formed for coupling the structure 60 and the chassis 20 having different materials.

The coupling part 100 may be formed by performing the burring punch process on the plate 21a of the rear chassis 40 so that the coupling part 100 includes the coupling hole 110 through which the fastening member 70 is inserted, and the burring 120 protruding from the edge of the coupling hole 110 to be inclined (S2-1).

Or, the coupling part 200 may be formed by performing the burring punch process on the plate 21a of the rear chassis 40 so that the coupling part 200 includes the coupling hole 210 through which the fastening member 70 is inserted, and the burring 220 protruding from the edge of the coupling hole 210 and having the screw thread 240 on the inner circumferential surface thereof (S2-2).

Or, the coupling part 300 may be formed by performing the electric discharge machining on the plate 21b of the front chassis 30 so that the coupling part 300 includes the concave/convex surface 350 provided to allow the reinforcing member 80 to be coupled (S2-3).

Next, in order to strengthen coupling of the structure 60 and the coupling parts 100, 200, and 300, the reinforcing parts 130, 230, and 330 may be selectively formed on at least one of the coupling holes 110 and 210, the burrings 120 and 220, the screw thread 240, and the concave/convex surface 350, which are in contact with the structure 60 (S3).

The reinforcing parts 130, 230, and 330 may be formed by performing the blasting process to increase the surface area of the coupling parts 100, 200, and 300. The reinforcing parts 130, 230, and 330 may be formed by applying the adhesive. The reinforcing parts 130, 230, and 330 may be formed by performing the chemical etching process to increase the undercut. However, the present disclosure is not limited thereto.

Finally, by stacking and molding the structure 60 onto the plate 21 by the 3D printing (three dimensional printing), the structure 60 may be fastened to the coupling part 100 and coupled to the chassis 20 (S4).

Although the technical idea of the present disclosure has been described above by way of specific embodiments, the scope of the present disclosure is not limited to these embodiments.

However, it will be understood by those skilled in the art that various changes in form and details may be made therein without departing from the spirit and scope of the disclosure as defined by the appended claims.

What is claimed is:

1. A display apparatus comprising:
a display panel;
a chassis comprising a plate provided to cover the display panel, and a coupling part on the plate; and
stacked structures formed by melting a resin and stacking the melted resin on the plate by 3D printing on the plate and thereby coupled to the coupling part, and
wherein the coupling part includes:

a coupling hole provided on the plate so that a lower structure of the stacked structures is inserted in the coupling hole, and a burring protruding from an edge of the coupling hole, the burring inclined outwardly from the coupling hole, and wherein the stacked structures are stacked around the burring so that the stacked structures interfere with the burring and prevent the stacked structures from being separated from the coupling part.

2. The display apparatus according to claim 1, wherein the coupling part is integrally formed with the plate and has a material different from that of the stacked structures.

3. The display apparatus according to claim 2, wherein the coupling part comprises a metal material.

4. The display apparatus according to claim 3, wherein the stacked structures are melted pelletized resin.

5. The display apparatus according to claim 1, wherein
the chassis further comprises a rear chassis configured to cover a rear of the display panel, and
the stacked structures include a fastening member provided to be fastened to a printed circuit board mounted on the rear chassis.

6. The display apparatus according to claim 1, wherein
the chassis further comprises a front chassis configured to cover a front of the display panel, and
the stacked structures include a reinforcing member provided to reinforce rigidity of the front chassis.

7. The display apparatus according to claim 1, wherein the coupling part includes an undercut to prevent the stacked structures from being separated from the coupling part.

8. The display apparatus according to claim 1, wherein the burring includes a screw thread on an inner circumferential surface of the burring.

9. The display apparatus according to claim 1, wherein the coupling part includes a concave/convex surface on a surface of the plate and interfering with at least one structure of the stacked structures.

10. The display apparatus according to claim 9, wherein the concave/convex surface is finely formed on a surface of the plate by electric discharge machining.

11. The display apparatus according to claim 1, wherein the coupling part includes a reinforcing part in contact with at least one structure of stacked structures to strengthen coupling of the stacked structures and the coupling part.

12. A display apparatus comprising:

a display panel;

a chassis including a plate covering the display panel, the plate including a coupling part having a coupling hole;

3D printed stacked structures stacked on the plate and having a lower structure inserted in the coupling hole, wherein the coupling part includes:

a burring protruding from, and inclined outwardly from, an edge of the coupling hole, and the 3D printed stacked structures are stacked around the burring so that the 3D printed stacked structures interfere with the burring and prevent the 3D printed stacked structures from being separated from the plate.

* * * * *